United States Patent
Han et al.

(10) Patent No.: US 12,200,997 B2
(45) Date of Patent: *Jan. 14, 2025

(54) DISPLAY PANEL FOR IMPROVING DISPLAY EFFECT IN LOW-RESOLUTION AREA, MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Linhong Han, Beijing (CN); Yi Zhang, Beijing (CN); Hengzhen Liang, Beijing (CN); Shikai Qin, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/196,694

(22) Filed: May 12, 2023

(65) Prior Publication Data
US 2023/0284499 A1    Sep. 7, 2023

Related U.S. Application Data

(63) Continuation of application No. 17/536,868, filed on Nov. 29, 2021, now Pat. No. 11,696,478, which is a
(Continued)

(51) Int. Cl.
*H10K 59/35* (2023.01)
*H10K 59/12* (2023.01)
(Continued)

(52) U.S. Cl.
CPC ......... *H10K 59/352* (2023.02); *H10K 59/122* (2023.02); *H10K 59/351* (2023.02);
(Continued)

(58) Field of Classification Search
None
See application file for complete search history.

(56) References Cited

U.S. PATENT DOCUMENTS

| | | | |
|---|---|---|---|
| 8,587,742 B2 * | 11/2013 | Kimura | G09G 3/2085 349/33 |
| 10,930,233 B1 * | 2/2021 | Huang | H10K 50/844 |

(Continued)

FOREIGN PATENT DOCUMENTS

| CN | 105448951 A | 3/2016 |
|---|---|---|
| CN | 205355055 U | 6/2016 |

(Continued)

OTHER PUBLICATIONS

CN Application No. 201980000089.2, Notification to Grant Patent Right for Invention, Apr. 13, 2022.
(Continued)

*Primary Examiner* — Nduka E Ojeh
(74) *Attorney, Agent, or Firm* — The Webb Law Firm (57) ABSTRACT

The present disclosure provides a display panel, a manufacturing method thereof, and a display device. The display panel includes a first area and a second area. A pixel density of the first area is greater than that of the second area. In the second area, each pixel includes a first sub-pixel, a second sub-pixel, a third sub-pixel, and a fourth sub-pixel. The first sub-pixel, the third sub-pixel, and the fourth sub-pixel are in a same sub-pixel row. The first sub-pixel is between the third sub-pixel and the fourth sub-pixel. The first sub-pixel and the second sub-pixel are in a same sub-pixel column. The first sub-pixel and the second sub-pixel are respectively in
(Continued)

adjacent sub-pixel rows. The first sub-pixel and the second sub-pixel has a same emission color. The first sub-pixel, the third sub-pixel, and the fourth sub-pixel have different emission colors.

20 Claims, 5 Drawing Sheets

Related U.S. Application Data continuation of application No. 16/623,180, filed as application No. PCT/CN2019/073476 on Jan. 28, 2019, now Pat. No. 11,211,430.

(51) Int. Cl.
  *H10K 59/122* (2023.01)
  *H10K 59/60* (2023.01)
  *H10K 71/00* (2023.01)
  *H10K 71/16* (2023.01)

(52) U.S. Cl.
  CPC ............ *H10K 59/60* (2023.02); *H10K 71/00* (2023.02); *H10K 71/164* (2023.02); *H10K 71/166* (2023.02); *H10K 59/1201* (2023.02)

(56) References Cited

U.S. PATENT DOCUMENTS

| | | | | |
|---|---|---|---|---|
| 11,696,478 | B2* | 7/2023 | Han | G02F 1/1337 257/40 |
| 2015/0270317 | A1* | 9/2015 | Lee | H10K 59/353 257/40 |
| 2016/0013251 | A1 | 1/2016 | Yoshida et al. | |
| 2016/0063911 | A1 | 3/2016 | Wu et al. | |
| 2016/0196870 | A1 | 7/2016 | Miyano | |
| 2018/0088260 | A1 | 3/2018 | Jin et al. | |
| 2018/0165533 | A1* | 6/2018 | Cho | G09G 5/003 |
| 2020/0176522 | A1 | 6/2020 | Zhao et al. | |
| 2021/0020664 | A1 | 1/2021 | Tan | |
| 2021/0065625 | A1 | 3/2021 | Wang et al. | |
| 2021/0217821 | A1 | 7/2021 | Han et al. | |

FOREIGN PATENT DOCUMENTS

| | | |
|---|---|---|
| CN | 107329329 A | 11/2017 |
| CN | 107680990 A | 2/2018 |
| CN | 108234693 A | 6/2018 |
| CN | 108511481 A | 9/2018 |
| CN | 207817361 U | 9/2018 |
| IN | 108511481 A | 9/2018 |

OTHER PUBLICATIONS

PCT/CN2019/073476 International Search Report and Written Opinion, Sep. 11 and 27, 2019.
U.S. Appl. No. 16/623,180 Notice of Allowance and Fee(s), Aug. 17, 2021.
U.S. Appl. No. 16/623,180 Notice of References Cited, May 12, 2021.
U.S. Appl. No. 16/623,180 Notice of References Cited, Aug. 17, 2021.
U.S. Appl. No. 16/623,180 Office Action, May 12, 2021.
U.S. Appl. No. 17/536,868 Information Disclosure Statement, Nov. 29, 2021.
U.S. Appl. No. 17/536,868 Notice of Allowance and Fee(s) Due, Feb. 24, 2023.
U.S. Appl. No. 17/536,868 Notice of References Cited, Feb. 24, 2023.

* cited by examiner

Provide an initial structure comprising a substrate and a pixel definition layer on the substrate, the substrate comprising a first portion for forming the first area and a second portion for forming the second area, the pixel definition layer comprising a plurality of openings, and a density of openings of the pixel definition layer on the first portion is greater than that of openings of the pixel definition layer on the second portion — S602

Form a light emitting layer on the initial structure by using a mask and by an evaporation process, with a part of the light emitting layer formed in the plurality of openings — S604

DISPLAY PANEL FOR IMPROVING DISPLAY EFFECT IN LOW-RESOLUTION AREA, MANUFACTURING METHOD THEREOF, AND DISPLAY DEVICE

CROSS-REFERENCE TO RELATED APPLICATIONS

The present application is a Continuation Application of U.S. patent application Ser. No. 17/536,868, filed Nov. 29, 2021, which is a Continuation Application of U.S. patent application Ser. No. 16/623,180, filed Dec. 16, 2019 (now U.S. Pat. No. 11,211,430), which is the U.S. National Stage Application under 35 U.S.C. § 371 of International Patent Application No. PCT/CN2019/073476, filed on Jan. 28, 2019, the disclosures of each of which are incorporated by reference herein in its entirety.

TECHNICAL FIELD

The present disclosure relates to the field of display technology, and in particular, to a display panel, a manufacturing method thereof, and a display device.

BACKGROUND

At present, ordinary terminal display products (e.g., an AMOLED (Active-Matrix Organic Light emitting Diode) display screen) have a uniform resolution. For example, a QHD (Quarter High Definition) display screen or an FHD (Full High Definition) display screen have uniform resolution. However, such display products are no longer able to meet people's needs for display screens. With the development of small and medium-sized display screens, terminal display products are moving toward smaller and smaller appearance frames. The smart function devices or sensor devices (such as infrared induction devices) to be mounted may occupy a major part of the frame.

SUMMARY

According to one aspect of embodiments of the present disclosure, a display panel is provided. The display panel comprises: a first area and a second area, wherein a pixel density of the first area is greater than that of the second area; wherein in the second area, each pixel comprises a first sub-pixel, a second sub-pixel, a third sub-pixel, and a fourth sub-pixel; the first sub-pixel, the third sub-pixel, and the fourth sub-pixel are in a same sub-pixel row, the first sub-pixel is between the third sub-pixel and the fourth sub-pixel, and the first sub-pixel, the third sub-pixel, and the fourth sub-pixel have different emission colors; and the first sub-pixel and the second sub-pixel are in a same sub-pixel column; the first sub-pixel and the second sub-pixel are respectively in adjacent sub-pixel rows, or the first sub-pixel and the second sub-pixel share a same sub-pixel driving circuit; and the first sub-pixel and the second sub-pixel has a same emission color.

In some embodiments, the first sub-pixel and the second sub-pixel are both green sub-pixels, the third sub-pixel is a red sub-pixel, and the fourth sub-pixel is a blue sub-pixel.

In some embodiments, the second area comprises a plurality of non-light-emitting areas; in the second area, two pixels in a same pixel row are spaced apart by at least one non-light-emitting area.

In some embodiments, in two adjacent pixel rows of the second area, a pixel in one pixel row of the two adjacent pixel rows and an adjacent pixel in another pixel row of the two adjacent pixel rows are in a same pixel column.

In some embodiments, in two adjacent pixel rows of the second area, a pixel in one pixel row of the two adjacent pixel rows and an adjacent pixel in another pixel row of the two adjacent pixel rows are in different pixel columns.

In some embodiments, in the two adjacent pixel rows of the second area, in a case where a pixel in the one pixel row of the two adjacent pixel rows and an adjacent pixel in the another pixel row of the two adjacent pixel rows are in different pixel columns, the fourth sub-pixels of these two pixels are in a same sub-pixel column, and the third sub-pixels of these two pixels are in different sub-pixel columns; or the third sub-pixels of these two pixels are in a same sub-pixel column, and the fourth sub-pixels of these two pixels are in different sub-pixel columns.

In some embodiments, a sub-pixel of the first area that is in a same sub-pixel column as a green sub-pixel of the second area is a green sub-pixel.

In some embodiments, in each pixel of the second area, a light emitting device of the first sub-pixel of the each pixel and a light emitting device of the second sub-pixel of the each pixel are electrically connected to the same sub-pixel driving circuit.

In some embodiments, in each pixel of the second area, a light emitting device of the first sub-pixel of the each pixel is electrically connected to one sub-pixel driving circuit, and a light emitting device of the second sub-pixel of the each pixel is electrically connected to another sub-pixel driving circuit.

In some embodiments, each sub-pixel row comprises a plurality of sub-pixels electrically connected to a same gate line; each sub-pixel column comprises a plurality of sub-pixels electrically connected to a same data line.

In some embodiments, an area of an opening of the red sub-pixel in the second area is greater than that of an opening of the red sub-pixel in the first area; an area of the opening of a green sub-pixel in the second area is greater than that of an opening of the green sub-pixel in the first area; an area of the opening of the blue sub-pixel in the second area is greater than that of an opening of the blue sub-pixel in the first area.

In some embodiments, in partial pixels of the second area, an opening of the third sub-pixel and an opening of the fourth sub-pixel are in a same opening row, an opening of the first sub-pixel is in a next opening row adjacent to an opening row where the opening of the third sub-pixel is located, an opening of the second sub-pixel is in a previous opening row adjacent to the opening row where the opening of the third sub-pixel is located.

In some embodiments, in partial pixels of the second area, an opening of the third sub-pixel and an opening of the fourth sub-pixel are in a same opening row, an opening of the first sub-pixel and an opening of the second sub-pixel are between the opening of the third sub-pixel and the opening of the fourth sub-pixel, and the opening of the first sub-pixel and the opening of the second sub-pixel are in a same opening column.

In some embodiments, a proportion of openings of sub-pixels of each pixel in the second area is equal to that of openings of sub-pixels of each pixel in the first area.

According to another aspect of embodiments of the present disclosure, a display device is provided. The display device comprises: the display panel as described previously.

In some embodiments, the display device further comprises: a sensor mounted on a backside of the second area of the display panel.

According to another aspect of embodiments of the present disclosure, a manufacturing method for the display panel as described previously is provided. The manufacturing method comprises: providing an initial structure comprising a substrate and a pixel definition layer on the substrate, the substrate comprising a first portion for forming the first area and a second portion for forming the second area, the pixel definition layer comprising a plurality of openings, and a density of openings of the pixel definition layer on the first portion is greater than that of openings of the pixel definition layer on the second portion; and forming a light emitting layer on the initial structure by using a mask and by an evaporation process, with a part of the light emitting layer formed in the plurality of openings, wherein the mask comprises a plurality of through holes, a part of the plurality of through holes exposes the plurality of openings, and a density of through holes in the mask corresponding to the first portion is equal to that of through holes in the mask corresponding to the second portion.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element (s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, a smart function device or a sensor device may be provided on the backside of the display screen. However, the inventors of the present disclosure have found that, since the backplane circuit of the display panel has a relatively high wiring density, this may cause, for example, the transmittance of infrared light to decrease, which will not achieve the purpose of infrared detection. The inventors of the present disclosure propose that, the backplane circuit may be divided into different areas, so that the screen is divided into a high-resolution area and a low-resolution area, and the smart function device or a sensor device may be provided on the backside of the low-resolution area. However, considering the display requirements, in the case where the resolution of the low-resolution area is reduced to a certain extent, if the RGBG sub-pixel arrangement manner is used in the low-resolution area (R represents a red sub-pixel, G represents a green sub-pixel, and B represents a blue sub-pixel), with a large pitch between adjacent pixels, it is very difficult to display when one pixel borrows a sub-pixel (e.g. a green sub-pixel) from another pixel for display.

In view of this, embodiments of the present disclosure provide a display panel to improve the display effect in the low-resolution area.

Figure 1:
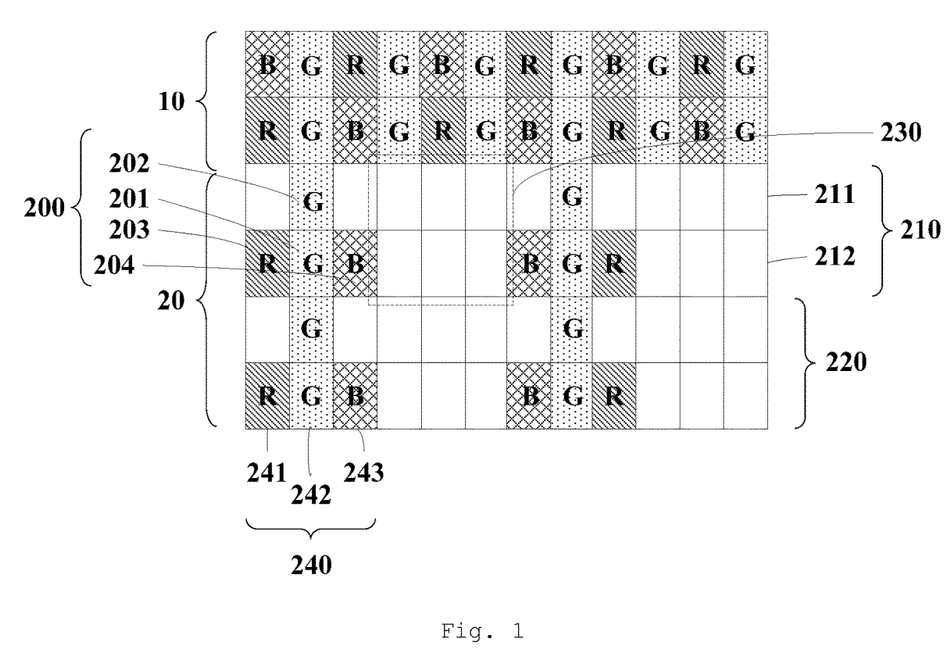
FIG. 1 is a schematic view showing a sub-pixel arrangement of a display panel according to an embodiment of the present disclosure.

FIG. 1 is a schematic view showing a sub-pixel arrangement of a display panel according to an embodiment of the present disclosure.

As shown in FIG. 1, the display panel comprises a first area 10 and a second area 20. The pixel density of the first area 10 is greater than that of the second area 20. That is, the number of pixels per unit area in the first area 10 is greater than the number of pixels per unit area in the second area 20. In this way, a resolution of the first area is higher than that of the second area. The first area may be referred to as a high-resolution area (referred to as an H area), and the second area may be referred to as a low-resolution area (referred to as an L area). For example, a PPI (pixels per inch) of the first area may be about 400, and a PPI of the second area may be about 170. It is verified that, the display effect with a minimum PPI of about 170 may be visually accepted. Of course, the range of the PPI of the second area in embodiments of the present disclosure is not limited to 170.

As shown in FIG. 1, in the second area 20, each pixel 200 may comprise a first sub-pixel 201, a second sub-pixel 202, a third sub-pixel 203, and a fourth sub-pixel 204. The first sub-pixel 201, the third sub-pixel 203, and the fourth sub-pixel 204 are in a same sub-pixel row. For example, the first sub-pixel 201, the third sub-pixel 203, and the fourth sub-pixel 204 are in a same sub-pixel row 212. The first sub-pixel 201 is between the third sub-pixel 203 and the fourth sub-pixel 204. The first sub-pixel 201 and the second sub-pixel 202 are in a same sub-pixel column. The first sub-pixel 201 and the second sub-pixel 202 are respectively in adjacent sub-pixel rows. For example, the first sub-pixel 201 is in the sub-pixel row 212, and the second sub-pixel 202 is in another sub-pixel row 211 adjacent to the sub-pixel row 212. In this way, the first sub-pixel 201 is adjacent to the second sub-pixel 202. In other embodiments, the first sub-pixel 201 and the second sub-pixel 202 share a same sub-pixel driving circuit. For example, alight emitting device of the first sub-pixel 201 and a light emitting device of the second sub-pixel 202 are electrically connected to the same sub-pixel driving circuit. The first sub-pixel 201 and the second sub-pixel 202 has a same emission color. The first sub-pixel 201, the third sub-pixel 203, and the fourth sub-pixel 204 have different emission colors.

In some embodiments, as shown in FIG. 1, the first sub-pixel 201 and the second sub-pixel 202 may both be green sub-pixels G, the third sub-pixel 203 may be a red sub-pixel R, and the fourth sub-pixel 204 may be a blue sub-pixel B. Of course, the scope of embodiments of the present disclosure is not limited thereto. For example, the first sub-pixel and the second sub-pixel may both be red sub-pixels, the third sub-pixel may be a blue sub-pixel, and the fourth sub-pixel may be a green sub-pixel. For another example, the first sub-pixel and the second sub-pixel may both be blue sub-pixels, the third sub-pixel may be a red sub-pixel, and the fourth sub-pixel may be a green sub-pixel.

In some embodiments of the present disclosure, each sub-pixel row comprises a plurality of sub-pixels electrically connected to a same gate line (not shown). For example, each sub-pixel comprises a sub-pixel driving circuit, and the sub-pixel driving circuits of the sub-pixels in the same sub-pixel row are electrically connected to the same gate line.

In some embodiments of the present disclosure, each sub-pixel column comprises a plurality of sub-pixels electrically connected to a same data line (not shown). For example, each sub-pixel comprises the sub-pixel driving circuit, and the sub-pixel driving circuits of the sub-pixels in the same sub-pixel column are electrically connected to the same data line.

In the above-described embodiment, the display panel comprises a first area having a high resolution and a second area having a low resolution. In the second area, each pixel comprises a first sub-pixel, a second sub-pixel, a third sub-pixel, and a fourth sub-pixel. The first sub-pixel, the third sub-pixel, and the fourth sub-pixel are in the same sub-pixel row. The first sub-pixel is between the third sub-pixel and the fourth sub-pixel. The first sub-pixel and the second sub-pixel are in the same sub-pixel column. The first sub-pixel is adjacent to the second sub-pixel. In this way, when the second area having the low resolution is displayed, one pixel of the second area does not need to borrow a sub-pixel from another pixel for display, so that the display effect of the second area (i.e., the low-resolution area) may be improved.

In some embodiments, as shown in FIG. 1, the second area 20 may comprise a plurality of non-light-emitting areas 230. For example, each non-light-emitting area 230 may occupy an area having a size of 2×3 sub-pixels. In the second area 20, two pixels in a same pixel row are spaced apart by at least one non-light-emitting area 230.

For example, each pixel row comprises two adjacent sub-pixel rows. For example, the pixel row 210 may comprise the sub-pixel rows 211 and 212. Since each pixel comprises the third sub-pixel, the fourth sub-pixel, and the first sub-pixel, all of which are in one sub-pixel row, and the second sub-pixel in another (for example a previous) sub-pixel row, each pixel row may comprise two adjacent sub-pixel rows.

For another example, when the first sub-pixel and the second sub-pixel share the same sub-pixel driving circuit, the first sub-pixel and the second sub-pixel are electrically connected to the same gate line. In this case, each pixel row may comprise one sub-pixel row.

In some embodiments, in two adjacent pixel rows of the second area, a pixel in one pixel row of the two adjacent pixel rows and an adjacent pixel in another pixel row of the two adjacent pixel rows are in a same pixel column. For example, in the second area, each pixel column comprises three adjacent sub-pixel columns. For example, as shown in FIG. 1, a pixel column 240 may comprise sub-pixel columns 242, 241 and 243 in which the first sub-pixel (or the second sub-pixel), the third sub-pixel, and the fourth sub-pixel in a same pixel are located respectively. As shown in FIG. 1, in two adjacent pixel rows of the second area, a pixel (which for example, may be referred to as a first pixel) in one pixel row 210 and another pixel (which for example, may be referred to as a second pixel) adjacent to the pixel (i.e., the first pixel) in another pixel row 220 are in the same pixel column 240. In addition, as shown in FIG. 1, different pixel columns are spaced apart by a plurality of non-light-emitting areas in a same column.

In some embodiments, for example, as shown in FIG. 1, a sub-pixel of the first area 10 that is in a same sub-pixel column as a green sub-pixel G of the second area 20 is a green sub-pixel G. In other words, there are no red sub-pixels and blue sub-pixels in the sub-pixel columns where the green sub-pixels in the display panel are located.

In some embodiments, in each pixel 200 of the second area, a light emitting device of the first sub-pixel 201 (e.g., the green sub-pixel) of the each pixel is electrically connected to one sub-pixel driving circuit (not shown in FIG. 1), and a light emitting device of the second sub-pixel 202 (e.g., the green sub-pixel) of the each pixel is electrically connected to another sub-pixel driving circuit (not shown in FIG. 1). That is, in the pixel of the second area, the first sub-pixel comprises one sub-pixel driving circuit, and the second sub-pixel comprises another sub-pixel driving circuit. The light emitting devices of the two sub-pixels are driven to emit light through different sub-pixel driving circuits, respectively.

In other embodiments, in each pixel 200 of the second area, a light emitting device of the first sub-pixel 201 (e.g., the green sub-pixel) of the each pixel and a light emitting device of the second sub-pixel 202 (e.g., the green sub-pixel) of the each pixel are electrically connected to the same sub-pixel driving circuit. That is, the light emitting device of the first sub-pixel and the light emitting device of the second sub-pixel of each pixel in the second area are driven to emit light through the same sub-pixel driving circuit. In this way, each pixel may omit a sub-pixel driving circuit of one sub-pixel, so that one sub-pixel driving circuit drives light emitting devices of two sub-pixels having the same color (e.g. the green sub-pixels) to emit light. This may reduce the circuit complexity of the second area and improve the light transmittance of the second area.

Figure 2:
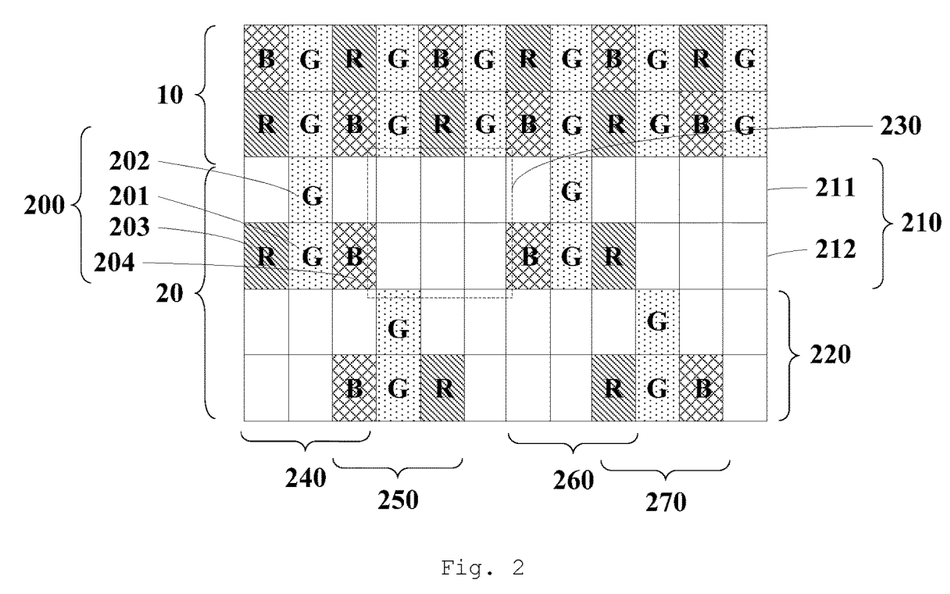
FIG. 2 is a schematic view showing a sub-pixel arrangement of a display panel according to another embodiment of the present disclosure.

In some embodiments, as shown in FIG. 2, the sub-pixel arrangement manner of each pixel in the first area (i.e., the high-resolution area) is RGBG or BGRG.

FIG. 2 is a schematic view showing a sub-pixel arrangement of a display panel according to another embodiment of the present disclosure.

In some embodiments, as shown in FIG. 2, in two adjacent pixel rows of the second area 20, a pixel in one pixel row 210 of the two adjacent pixel rows and an adjacent pixel in another pixel row 220 of the two adjacent pixel rows are in different pixel columns. For example, one pixel (for example which may be referred to as a first pixel) in the pixel row 210 is in a pixel column 240, and a pixel (for example which may be referred to as a second pixel) in the pixel row 220 that is adjacent to the first pixel is in a pixel column 250. Therefore, the two adjacent pixels in different pixel rows are in different pixel columns.

For example, in the second area, each pixel column may comprise three adjacent sub-pixel columns. It should be noted that, different pixel columns may not have a common sub-pixel column, for example, as shown in FIG. 1; or different pixel columns may have a common sub-pixel column, for example, the pixel columns 240 and 250 as shown in FIG. 2 have a common sub-pixel column.

By the above-described sub-pixel arrangement, the pixel rows of the second area (i.e., the low-resolution area) may be staggered. For example, the first row is RGGB and BGGR, and the next row becomes BGGR and RGGB. This may reduce a color edge phenomenon. Here, the color edge phenomenon is a poor display effect that is visually perceivable. For example, if a white rectangular frame, a triangular frame, or hypotenuse is displayed, color lines instead of white lines may be seen at an edge line position of a pattern. This phenomenon is referred to as the color edge phenomenon.

In some embodiments, in two adjacent pixel rows of the second area, in a case where a pixel in one pixel row of the two adjacent pixel rows and an adjacent pixel in another pixel row of the two adjacent pixel rows are in different pixel columns, fourth sub-pixels of these two pixels are in a same sub-pixel column, and third sub-pixels of these two pixels are in different sub-pixel columns. For example, as shown in FIG. 2, in the second area 20, for two adjacent pixels in the pixel columns 240 and 250, the fourth sub-pixels (e.g., blue sub-pixels) of the two pixels are in the same sub-pixel column, and the third sub-pixels (e.g., red sub-pixels) of the two pixels are in different sub-pixel columns. This may reduce the color edge phenomenon.

In other embodiments, in two adjacent pixel rows of the second area, in the case where a pixel in one pixel row of the two adjacent pixel rows and an adjacent pixel in another pixel row of the two adjacent pixel rows are in different pixel columns, the third sub-pixels of these two pixels are in a same sub-pixel column, and the fourth sub-pixels of these two pixels are in different sub-pixel columns. For example, as shown in FIG. 2, in the second area 20, for two adjacent pixels in the pixel columns 260 and 270, the third sub-pixels (e.g., red sub-pixels) of the two pixels are in the same sub-pixel column, and the fourth sub-pixels (e.g., blue sub-pixels) of the two pixels are in different sub-pixel columns. This may reduce the color edge phenomenon.

Figure 3A:
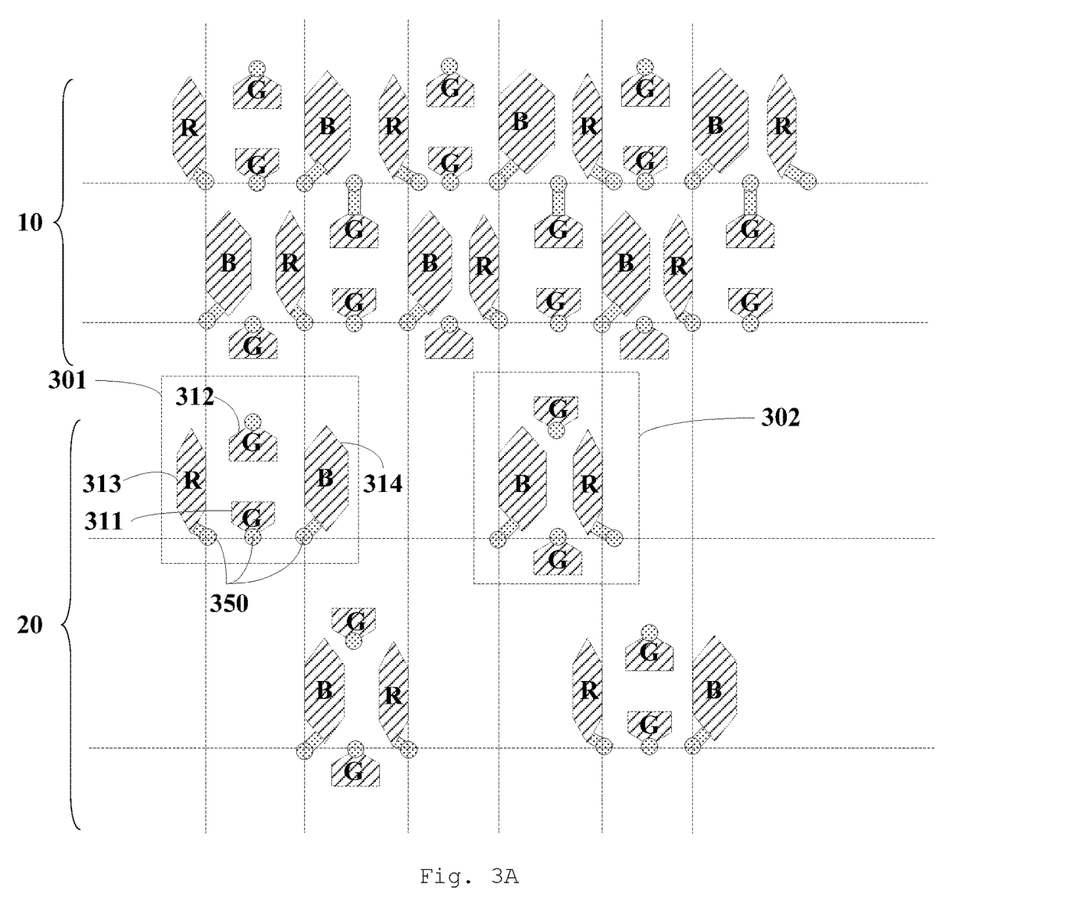
FIG. 3A is a schematic view showing an opening arrangement of a sub-pixel of a display panel according to an embodiment of the present disclosure.

FIG. 3A is a schematic view showing an opening arrangement of a sub-pixel of a display panel according to an embodiment of the present disclosure. FIG. 3A shows an embodiment in which the light emitting device of the first sub-pixel and the light emitting device of the second sub-pixel do not share one sub-pixel driving circuit. Herein, an opening of each sub-pixel refers to an opening of the pixel defining layer (referred to as PDL for short) corresponding to the each sub-pixels. As shown in FIG. 3A, the sub-pixels of different colors have different opening shapes. FIG. 3A shows an opening 311 of the first sub-pixel (e.g., one green sub-pixel G), an opening 312 of the second sub-pixel (e.g., another green sub-pixel G), and an opening 313 of the third sub-pixel (e.g., the red sub-pixel) and an opening 314 of the fourth sub-pixel (e.g., the blue sub-pixel). The openings (a total of 4 openings) of the respective sub-pixels comprised in each pixel may form an opening group, such as opening groups 301 and 302 shown in FIG. 3A.

Here, the row in which the opening of the sub-pixel is located may be defined as an "opening row", and the column in which the opening of the sub-pixel is located is defined as an "opening column".

In some embodiments, in partial pixels of the second area, the openings of the sub-pixels in a same sub-pixel row may be in a same opening row. In the following, the opening group 301 in FIG. 3A is taken as an example for description. In the opening group 301, the opening 313 of the third sub-pixel (e.g., the red sub-pixel R) and the opening 314 of the fourth sub-pixel (e.g., the blue sub-pixel B) are in the same opening row. The opening 311 of the first sub-pixel (e.g., one green sub-pixel G) and the opening 312 of the second sub-pixel (e.g., another green sub-pixel G) are between the opening 313 of the third sub-pixel and the opening 314 of the fourth sub-pixel. The opening 311 of the first sub-pixel and the opening 312 of the second sub-pixel are in a same opening column.

In other embodiments, in partial pixels of the second area, the openings of the sub-pixels in a same sub-pixel row may be in different opening rows. In the following, the opening group 302 in FIG. 3A is taken as an example for description. In the opening group 302, the opening of the third sub-pixel (e.g., the red sub-pixel R) and the opening of the fourth sub-pixel (e.g., the blue sub-pixel B) are in a same opening row. The opening of the first sub-pixel (e.g., one green sub-pixel G) is a next opening row adjacent to the opening row where the opening of the third sub-pixel (e.g., the red sub-pixel R) is located. The opening of the second sub-pixel (e.g., another green sub-pixel G) is a previous opening row adjacent to the opening row where the opening of the third sub-pixel (e.g., the red sub-pixel R) is located.

In some embodiments, a proportion of openings of sub-pixels of each pixel in the second area is equal to that of openings of sub-pixels of each pixel in the first area, which may reduce the probability of color cast.

Here, an area of the opening is substantially equal to a light emitting area of the sub-pixel. The proportion of the openings is a proportion of the light emitting areas of the RGB three-color sub-pixels of the pixel. Here, the light emitting area of the green sub-pixel is a sum of the light emitting areas of the two green sub-pixels in the pixel. For example, the proportion of the openings of the RGB three-color sub-pixels in the first area (i.e., the high-resolution area) is 1:1.2:1.6 (or 1:1.2:1.8), and the proportion of the openings of the RGB three-color sub-pixels in the second area is also 1:1.2:1.6 (or 1:1.2:1.8).

It should be noted that, the equal proportion of the openings of each pixel of the two areas described here comprises, but is not limited to, absolute equal proportion. For example, there may be a certain error, and within an error range, the proportion of the openings of the sub-pixels in the second area is substantially equal to the proportion of the openings of the sub-pixels in the first area.

In some embodiments, an area of the opening of the red sub-pixel in the second area is greater than that of the opening of the red sub-pixel in the first area. An area of the opening of the green sub-pixel in the second area is greater than that of the opening of the green sub-pixel in the first area. An area of the opening of the blue sub-pixel in the second area is greater than that of the opening of the blue sub-pixel in the first area. Since part of a light emitting layer within the opening emits light under the effect of an electric field, it is possible to enlarge the light emitting area of the second area (i.e., the low-resolution area), extend the service life of the second area and improve brightness of the second area by increasing the area of the opening of t the corresponding color sub-pixel in the second area.

In other embodiments, the area of the opening of the red sub-pixel in the second area may be equal to that of the opening of the red sub-pixel in the first area. The area of the opening of the green sub-pixel in the second area may be equal to that of the opening of the green sub-pixel in the first area. The area of the opening of the blue sub-pixel in the second area may be equal to that of the opening of the blue sub-pixel in the first area.

In some embodiments, a connection end 350 of each sub-pixel is also shown in FIG. 3A. For example, the connection ends 350 of the sub-pixels in the same sub-pixel row are electrically connected to the same gate line (not shown).

Figure 3B:
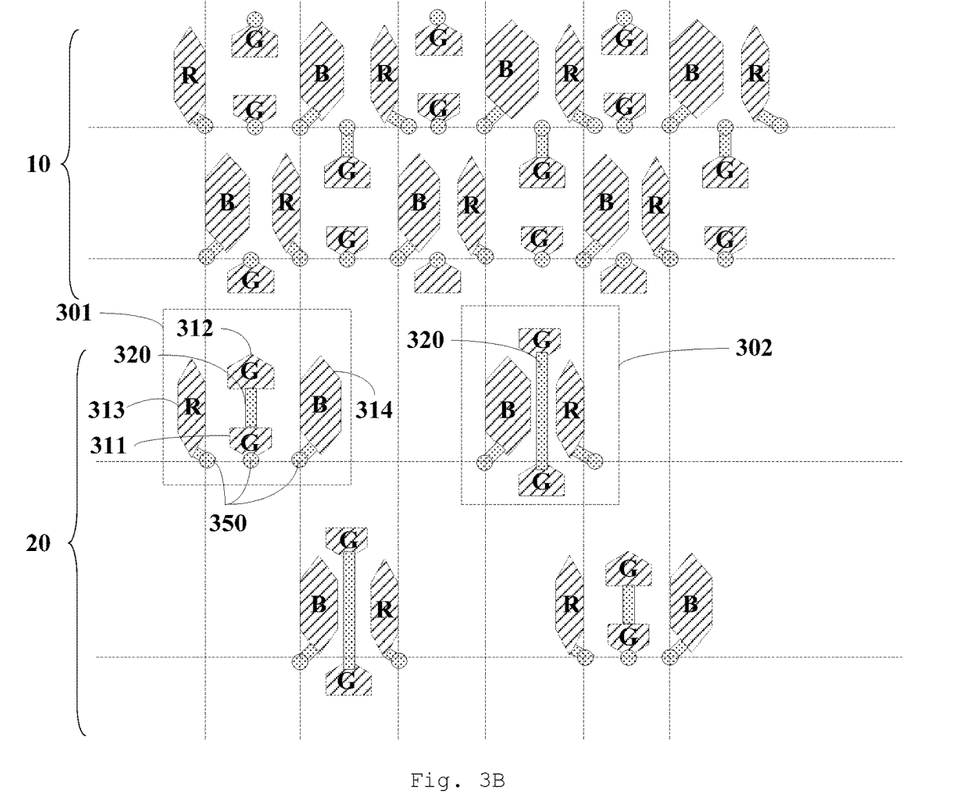
FIG. 3B is a schematic view showing an opening arrangement of a sub-pixel of a display panel according to another embodiment of the present disclosure.

FIG. 3B is a schematic view showing an opening arrangement of a sub-pixel of a display panel according to another embodiment of the present disclosure. In addition to the same or a similar structure as that shown in FIG. 3A, FIG. 3B also shows a connecting member 320. For example, the connecting member may be a wire. The connecting member 320 is electrically connected to the light emitting device of the first sub-pixel (e.g., one green sub-pixel G) and the light emitting device of the second sub-pixel (e.g., another green sub-pixel G), so that the light emitting device of the first sub-pixel and the light emitting device of the second sub-pixel are electrically connected to the same sub-pixel driving circuit. That is, the light emitting device of the first sub-pixel and the light emitting device of the second sub-pixel may share one sub-pixel driving circuit.

Figure 4:
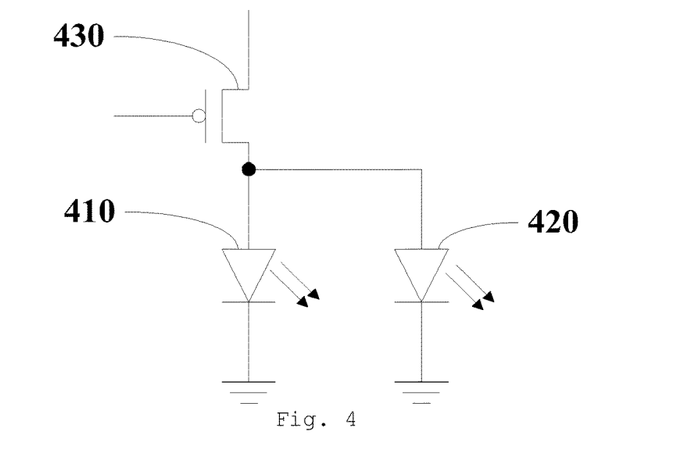
FIG. 4 is a schematic view showing a partial circuit structure of a first sub-pixel and a second sub-pixel in a pixel according to an embodiment of the present disclosure.

FIG. 4 is a schematic view showing a partial circuit structure of a first sub-pixel and a second sub-pixel in a pixel according to an embodiment of the present disclosure.

The light emitting device (which hereinafter may be referred to as a first light emitting device) 410 of the first sub-pixel and the light emitting device (which hereinafter may be referred to as a second light emitting device) 420 of the second sub-pixel are shown in FIG. 4. For example, the first light emitting device and the second light emitting device may both be OLEDs (Organic Light Emitting Diodes). An anode of the first light emitting device 410 and an anode of the second light emitting device 420 are electrically connected to an electrode (e.g., a source or a drain) of a same driving transistor 430. This means that the first light emitting device 410 and the second light emitting device 420 are electrically connected to the same sub-pixel driving circuit. It should be noted that, although other components of the sub-pixel driving circuit are not shown in FIG. 4, those skilled in the art can understand the circuit structure of the sub-pixel driving circuit. As shown in FIG. 4, a cathode of the first light emitting device 410 and a cathode of the second light emitting device 420 are both grounded.

In this embodiment, the light emitting device of the first sub-pixel and the light emitting device of the second sub-pixel of each pixel in the second area share one sub-pixel driving circuit, which may reduce the circuit complexity of the second area and improve the light transmittance of the second area.

Figure 5:
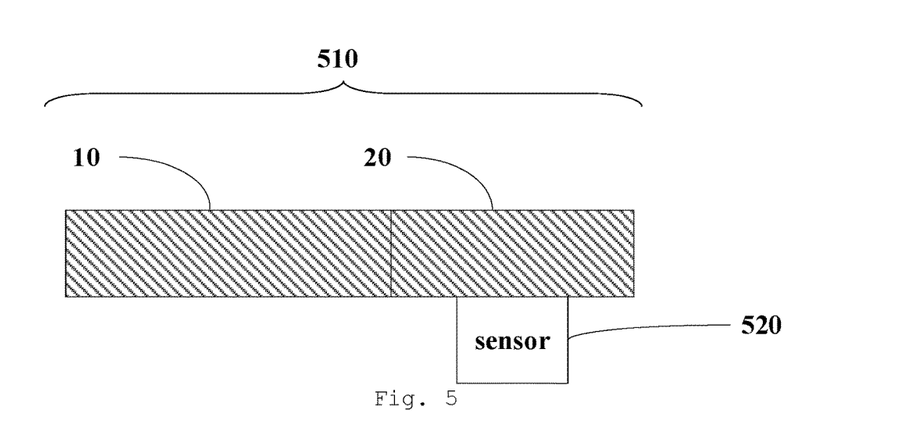
FIG. 5 is a schematic cross-sectional view showing a display device according to an embodiment of the present disclosure.

FIG. 5 is a schematic cross-sectional view showing a display device according to an embodiment of the present disclosure. As shown in FIG. 5, the display device may comprise a display panel 510. The display panel 510 may comprise the first area 10 and the second area 20. For example, the sub-pixel arrangement of the display panel 510 may be as shown in FIG. 1 or 2.

In some embodiments, as shown in FIG. 5, the display device may further comprise a sensor 520 mounted on a backside of the second area 20 of the display panel 510. For example, the sensor 520 may comprise an infrared sensor or the like. It should be noted that, the sensor may or may not be electrically connected to the display panel. By mounting the sensor on the backside of the second area having a low resolution, it is favorable for light (such as infrared light) to pass through the second area without being affected by the wiring density of the display panel as much as possible, so that the light is received by the sensor. This may improve the detection effect.

Figure 6:
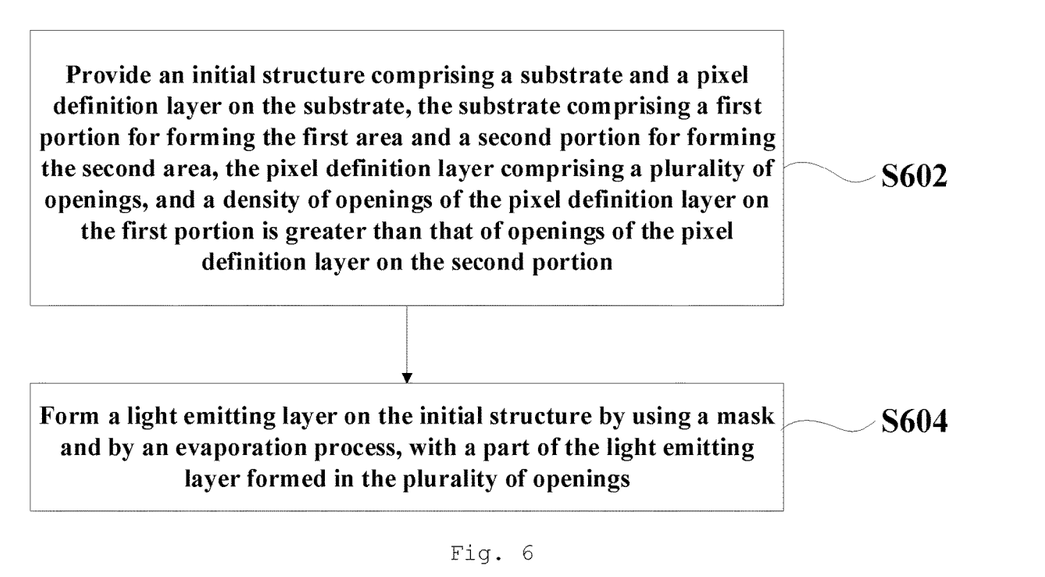
FIG. 6 is a flow chart showing a manufacturing method for a display panel according to an embodiment of the present disclosure.
Figure 7:
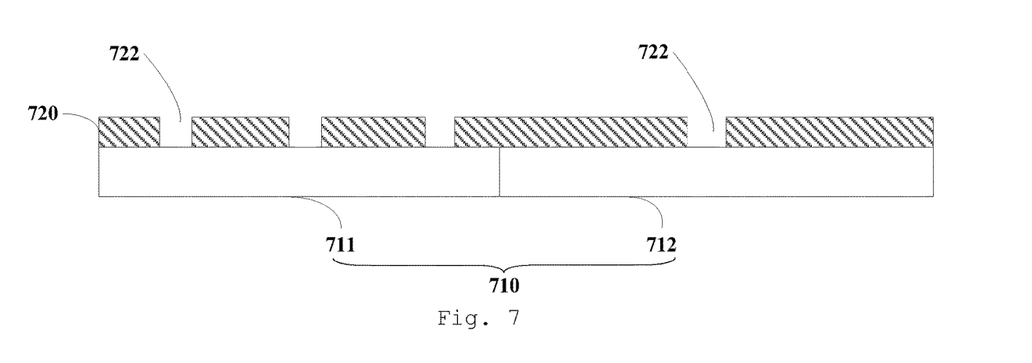
FIG. 7 is a schematic cross-sectional view showing a structure in one stage during manufacture of a display panel according to an embodiment of the present disclosure.
Figure 8:
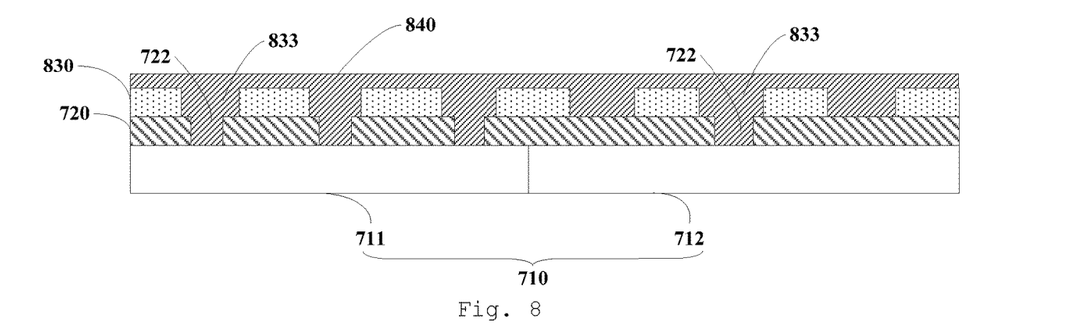
FIG. 8 is a schematic cross-sectional view showing a structure in another stage during manufacture of a display panel according to an embodiment of the present disclosure.
Figure 9:
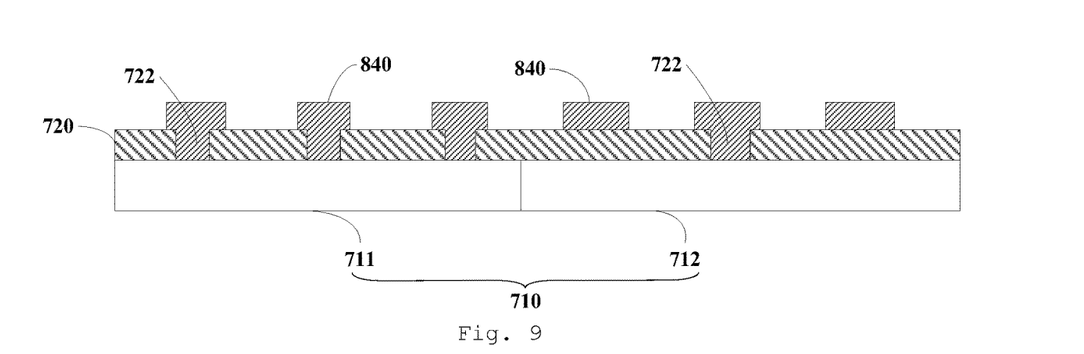
FIG. 9 is a schematic cross-sectional view showing a structure in another stage during manufacture of a display panel according to an embodiment of the present disclosure.

FIG. 6 is a flow chart showing a manufacturing method for a display panel according to an embodiment of the present disclosure. As shown in FIG. 6, the manufacturing method may comprise steps S602 to S604. FIGS. 7 to 9 are schematic cross-sectional views showing structures of several stages during manufacture of a display panel according to some embodiments of the present disclosure. The manufacturing method for the display panel according to some embodiments of the present disclosure will be described in detail below with reference to FIGS. 6 and 7 to 9.

As shown in FIG. 6, at step S602, an initial structure is provided. The initial structure comprises a substrate and a pixel definition layer on the substrate. The substrate comprises a first portion for forming the first area and a second portion for forming the second area. The pixel definition layer comprises a plurality of openings. A density of openings of the pixel definition layer on the first portion is greater than that of openings of the pixel definition layer on the second portion.

FIG. 7 is a schematic cross-sectional view showing a structure at step S602 during manufacture of a display panel according to an embodiment of the present disclosure. As shown in FIG. 7, an initial structure is provided. The initial structure may comprise a substrate 710 and a pixel definition layer 720 on the substrate 710. For example, the substrate may comprise a substrate layer (not shown) and a structural layer (not shown) on the substrate layer. For example, the substrate layer may comprise a flexible substrate layer. For example, the structural layer may comprise a structural layer (such as a source, a drain, a gate, a semiconductor layer, etc.) of a driving transistor or an anode layer or the like. The substrate 710 may comprise a first portion 711 for forming the first area and a second portion 712 for forming the second area.

As shown in FIG. 7, the pixel definition layer 720 may comprise a plurality of openings 722. A density of openings of the pixel definition layer 720 on the first portion 711 is greater than that of openings of the pixel definition layer 720 on the second portion 712. That is, the number of openings per unit area of the pixel definition layer 720 on the first portion 711 is greater than the number of openings per unit area of the pixel definition layer 720 on the second portion 712.

In some embodiments, the initial structure may further comprise functional layers (not shown) overlying the pixel definition layer 720 and the substrate 710. For example, the functional layers may comprise a hole transport layer, an electron blocking layer, and the like.

Returning to FIG. 6, at step S604, a light emitting layer is formed on the initial structure by using a mask and by an evaporation process, with a part of the light emitting layer formed in the plurality of openings.

FIGS. 8 and 9 are schematic cross-sectional views showing structures at two stages of step S602 during manufacture of a display panel according to some embodiments of the present disclosure. The process of the step S602 will be described below with reference to FIGS. 8 and 9.

For example, as shown in FIG. 8, a mask 830 is covered on the pixel definition layer 720. For example, the mask may be a fine metal mask (FMM). The mask 830 may comprise a plurality of through holes 833. A part of the plurality of through holes 833 exposes the plurality of openings 722. Here, the number of the through holes 833 is greater than that of the openings 722. Therefore, each opening 722 may be aligned with one through hole 833, but there may be no openings 722 below a part of the through holes 833. As shown in FIG. 8, a density of through holes in the mask 830 corresponding to the first portion 711 (i.e., corresponding to the first area) is equal to that of through holes in the mask 830 corresponding to the second portion 712 (i.e. corresponding to the second area).

Next, as shown in FIG. 8, a light emitting layer 840 is formed by using the mask 830 and by an evaporation process. The light emitting layer covers the mask 830, and fills the plurality of through holes 833 and the plurality of openings 722.

Next, as shown in FIG. 9, a part of the light emitting layer 840 outside the plurality of through holes 833 and the plurality of openings 722 is removed, and the mask 830 is removed, so that the light emitting layer 840 is divided into a plurality of portions.

Those skilled in the art can understand that, the manufacturing method for the display panel may further comprise steps for forming other functional layers (such as an electron transport layer and a hole blocking layer and the like) and a cathode layer (not shown). Those skilled in the art can understand the process of forming these layers according to the known art, which will not be described in detail here.

So far, a manufacturing method for a display panel according to some embodiments of the present disclosure is provided. In this manufacturing method, the density of the through holes of the mask corresponding to the first area is equal to that of the through holes of the mask corresponding to the second area. In this way, it is not necessary to manufacture the densities of the through holes of the mask corresponding to the two areas into different conditions, so that the manufacturing process is more convenient and simple. This may guarantee mass production to a certain extent.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the disclosure is defined by the following claims.

What is claimed is:

1. A display panel, comprising:
a first area and a second area, a pixel density of the first area being greater than a pixel density of the second area;
wherein the second area comprises at least a first sub-pixel and a second sub-pixel, the first sub-pixel and the second sub-pixel share one sub-pixel driving circuit, emission color of the first sub-pixel is the same as emission color of the second sub-pixel, and a shape of an opening of the first sub-pixel is the same as a shape of an opening of the second sub-pixel.

2. The display panel according to claim 1, wherein the first sub-pixel comprises a first light emitting device, and the second sub-pixel comprises a second light emitting device, wherein an anode of the first light emitting device and an anode of the second light emitting device are electrically connected to an electrode of a driving transistor of the one sub-pixel driving circuit.

3. The display panel according to claim 2, wherein the first light emitting device is electrically connected to the second light emitting device through a connecting member.

4. The display panel according to claim 3, wherein the first sub-pixel and the second sub-pixel are electrically connected to a same gate line.

5. The display panel according to claim 1, wherein a proportion of openings of sub-pixels of each pixel in the second area is equal to a proportion of openings of sub-pixels of each pixel in the first area.

6. The display panel according to claim 5, wherein an area of an opening of a red sub-pixel in the second area is equal to an area of an opening of a red sub-pixel in the first area.

7. The display panel according to claim 5, wherein an area of an opening of a green sub-pixel in the second area is equal to an area of an opening of a green sub-pixel in the first area.

8. The display panel according to claim 5, wherein an area of an opening of a blue sub-pixel in the second area is equal to an area of an opening of a blue sub-pixel in the first area.

9. The display panel according to claim 1, wherein an area of an opening of a red sub-pixel in the second area is greater than an area of an opening of a red sub-pixel in the first area.

10. The display panel according to claim 1, wherein an area of an opening of a green sub-pixel in the second area is greater than an area of an opening of a green sub-pixel in the first area.

11. The display panel according to claim 1, wherein an area of an opening of a blue sub-pixel in the second area is greater than an area of an opening of a blue sub-pixel in the first area.

12. The display panel according to claim 1, wherein the second area comprises a plurality of non-light-emitting areas, each of the plurality of non-light-emitting areas occupies an area having a size of 2×3 sub-pixels.

13. The display panel according to claim 1, wherein each pixel row in the second area comprises two adjacent sub-pixel rows.

14. The display panel according to claim 1, wherein in two adjacent pixel rows of the second area, a first pixel in one pixel row and a second pixel adjacent to the first pixel in another pixel row are in the same pixel column.

15. The display panel according to claim 3, wherein the second area further comprises a third sub-pixel and a fourth sub-pixel that are closest to the connecting member and are not connected, shortest distance between the third sub-pixel and the connecting member being approximately equal to shortest distance between the fourth sub-pixel and the connecting member.

16. The display panel according to claim 1, wherein a light emitting material of the first sub-pixel is the same as the light emitting material of the second sub-pixel.

17. A display panel, comprising:
a first area and a second area, a pixel density of the first area being greater than a pixel density of the second area;
wherein the second area comprises at least a first sub-pixel and a second sub-pixel, the first sub-pixel and the second sub-pixel share one sub-pixel driving circuit, emission color of the first sub-pixel is the same as emission color of the second sub-pixel, and a shape of an opening of the first sub-pixel is different from a shape of an opening of the second sub-pixel.

18. The display panel according to claim 17, wherein the first sub-pixel comprises a first light emitting device, and the second sub-pixel comprises a second light emitting device, wherein an anode of the first light emitting device and an anode of the second light emitting device are electrically connected to an electrode of a driving transistor of the one sub-pixel driving circuit.

19. The display panel according to claim 18, wherein the first light emitting device is electrically connected to the second light emitting device through a connecting member.

20. The display panel according to claim 19, wherein the first sub-pixel and the second sub-pixel are electrically connected to a same gate line.

* * * * *